United States Patent
Kwa

[11] Patent Number: 5,958,030
[45] Date of Patent: Sep. 28, 1999

[54] INTRA-SHELF FREE SPACE INTERCONNECT

[75] Inventor: Peter Tjing Hak Kwa, Kanata, Canada

[73] Assignee: Nortel Networks Corporation, Montreal, Canada

[21] Appl. No.: 08/773,832

[22] Filed: Dec. 27, 1996

[51] Int. Cl.$^6$ .............................. G06F 13/00; H02B 1/00
[52] U.S. Cl. .................... 710/101; 361/600; 361/720; 361/736; 361/731; 361/788
[58] Field of Search ............................ 710/101; 361/788, 361/600, 720, 736, 731; 340/825.79

[56] References Cited

U.S. PATENT DOCUMENTS

| | | | |
|---|---|---|---|
| 4,856,091 | 8/1989 | Taska | 455/607 |
| 5,432,486 | 7/1995 | Wong | 333/109 |
| 5,648,892 | 7/1997 | Wieloch et al. | 361/788 |
| 5,818,349 | 10/1998 | Dayton | 340/825.79 |
| 5,838,845 | 11/1998 | Leone et al. | 385/16 |

OTHER PUBLICATIONS

English Abstract of German Patent DE 39 08 786 C2, International Class G08C 17/00.

*Primary Examiner*—Ayaz R. Sheikh
*Assistant Examiner*—Frantz Blanchard Jean

[57] ABSTRACT

A free-space intra-shelf interconnect system is provided in which each of a number of circuit boards in a shelf communicates with any other board through free-space interconnects. Each board is equipped with a free-space transmit coupler to transmit a signal to a free-space receive coupler of an adjacent board. Simply sliding the boards in the shelf and latching them in place as usual, automatically aligns the transmit and receive couplers for optimum coupling. System configurations are provided for building a closed communication loop within the shelf, that allows for data communications between any board within the shelf. Logical addressing allows for interchangeability of boards within a shelf. This, in turn, allows for moving a defective board to the end positions of a shelf for debugging purposes. An extender board for testing and debugging purposes is also provided if free physical access to both board surface areas is simultaneously needed. A redundant system configuration with two communication loops in the shelf is provided which can survive the failure of any board.

35 Claims, 6 Drawing Sheets

INTRA-SHELF FREE SPACE INTERCONNECT

FIELD OF THE INVENTION

The invention relates to apparatus for communicating between circuit boards on a shelf.

BACKGROUND OF THE INVENTION

Data communication between circuit boards installed in a shelf has traditionally been done over communications links located on the shelf backplane. Each board has an edge connected through an edge connector to the backplane, and data is transmitted to the backplane and received from the backplane through the edge connector. Improving technology has allowed packaging densities on circuit boards to continuously increase. This has resulted in the requirement for larger capacity communications links to the backplane and these usually take the form of additional pins on the edge connector. These additional pins result in the requirement for an increased insertion force to be applied to install the board, and this in turn requires the boards to be reinforced. As the number of edge connector contact pins increases, the possibility of contact failures also increases.

German patent DE3908786 to Cordell, July 1991, discloses the use of optical, or radio free-space interconnections between adjacent boards to relieve congestion on the backplane or to remove the necessity for edge connectors. Each board in the shelf has a transmitter and a receiver for transmitting and receiving signals to and from adjacent boards. In the case in which a particular board does not require any communications capability, a hole is made in the board such that a board on one side of that particular board can communicate with the board on the other side of that particular board. A major disadvantage of the Cordell system is that not all boards have the same transmit/receive components such that the position of the board is important which precludes interchangeability of the boards. Additionally, each board can only communicate with the nearest appropriately equipped boards. Furthermore, Cordell has no signal rerouting capability to cope with the failure of a board, and does not provide a simple method of testing boards.

SUMMARY OF THE INVENTION

It is an object of the invention to provide a free-space intra-shelf interconnect system which obviates or mitigates one or more of the above identified disadvantages.

According to a first broad aspect, the invention provides free-space intra-shelf interconnect system comprising: a plurality of interchangeable circuit boards including a first board and a last board arranged in a shelf having a backplane; each board having a free-space transmit coupler for transmitting data mounted on a first side of the boards, a free-space receive coupler for receiving data mounted on a second side of the board, a backplane transmit coupler and a backplane receive coupler; each board having a drop-insert multiplexer for: i) inserting data to be transmitted by the board into an outgoing signal, the data including a logical address of a board to receive the data; and ii) extracting data addressed to the board from an incoming signal and forwarding on the outgoing signal all other data received on the incoming signal; the backplane having electrical conductors electrically connecting the backplane transmit coupler of the last board to the backplane receive coupler of the first board, whereby a closed data communication loop extends from the first board through all the intervening boards to the last board and back from the last board through the backplane to the first board.

It is noted that according to the invention, the data transmit and receive capability of each board is identical to that of the other boards. This means that the boards are all fully interchangeable without reconfiguring or moving components such as mirrors which might be located external to the boards. For example, one of the boards located between the first and last boards could be interchanged with the first or last board without having to alter any components or connections. The differences in operation are, firstly, when a board is in an end position the free-space transmit and receive couplers on the side of the board which does not face any adjacent board are not used and, secondly, when a board is in between the end positions the backplane receive and transmit couplers are not used.

It should also be noted that to provide logical addressing in the communications loop the board address is "burned" into the drop-insert multiplexer and does not depend on the physical location of the board.

According to the interconnect system of the invention the boards can be assembled in the shelf in any position because they are fully interchangeable. If a particular board proves to be defective it could be swapped with one of the end boards for debugging as the ends of the shelf are left open allowing physical access to the outward facing surfaces of the two end boards.

According to a second broad aspect, the invention provides a free-space intra-shelf interconnect system comprising: a plurality of interchangeable circuit boards including a first board and a last board arranged in a shelf having a backplane; each board having a pair of free-space transmit couplers for transmitting data mounted on opposite sides of the board and a pair of free-space receive couplers for receiving data mounted on opposite sides of the board; each board having a drop-insert multiplexer for: i) inserting data to be transmitted by the board into outgoing signals, the data including a logical address of a board to receive the data; and ii) extracting data addressed to the board from incoming signals and forwarding on the outgoing signals all other data received on the incoming signals whereby a closed data communication loop extends from the first board through all the intervening boards to the last board and back from the last board through all the intervening boards to the first board.

According to the second aspect of the invention the boards are also fully interchangeable. The only difference between this aspect and the first aspect is that, in this aspect, the communications loop is entirely through the boards and does not involve the backplane.

According to a third broad aspect, the invention provides a free-space intra-shelf interconnected system comprising: a plurality of interchangeable circuit boards including a first board and a last board arranged in a shelf having a backplane; each board having a pair of free-space transmit couplers for transmitting data mounted on opposite sides of the board, a pair of free-space receive couplers for receiving data mounted on opposite sides of the board, a backplane transmit coupler and a backplane receive coupler; each board having a drop-insert multiplexer for: i) inserting data to be transmitted by the board into outgoing signals, the data including the logical address of a board to receive the data; and ii) extracting data addressed to the board from incoming signals and forwarding the outgoing signals all other data received in the incoming signals; the backplane having electrical conductors electrically connecting the backplane transmit coupler of the last board to the backplane receive coupler of the first board and connecting the backplane transmit coupler of the first board to the backplane receive coupler of the last board, whereby a first closed data communication loop extends from the first board through all the intervening boards to the last board and back from the last board through the backplane to the first board and a second closed data communication loop extends from the last board through all the intervening boards to the first board, and back from the first board through the backplane to the last board.

As with the first two aspects the boards are fully interchangeable. In addition, two communications loop are provided, one through the boards and the backplane in one direction and another through the boards and the backplane in the opposite direction. This built-in redundancy permits communication to be maintained in the shelf by excluding a defective board.

According to a fourth broad aspect, the invention provides a special extender card for testing or debugging one of the boards in the system. The extender card comprises a) holding means for holding said specified board in an extended position; b) a first free-space receive coupler mounted on one side of the extender card for receiving from an adjacent board a first free-space signal which would have been the incoming signal of the specified board if it was installed normally; c) a first free-space transmit coupler mounted facing and at a normal spaced distance from the free-space receive coupler of the specified board in its extended position for retransmitting the first signal so as to be a free-space signal receivable by the free-space receive coupler of the specified board in its extended position; d) a second free-space receive coupler mounted facing and at the normal spaced distance from the free-space transmit coupler of the specified board in its extended position for receiving a second free-space signal which is the outgoing signal of the specified board in its extended position; and e) a second free-space transmit coupler mounted on the side of the extender card opposite said one side for retransmitting the second signal so as to be a free-space signal receivable by the free-space receive coupler of an adjacent board.

BRIEF DESCRIPTION OF THE DRAWINGS

Preferred embodiments of the invention will now be described with reference to the attached drawings in which.

DETAILED DESCRIPTION OF THE PREFERRED EMBODIMENTS

Figure 1A:
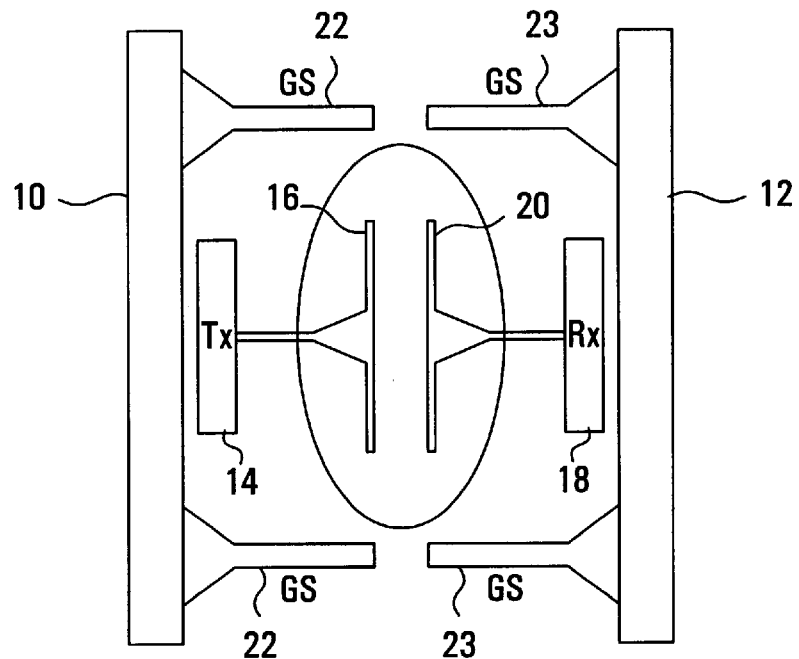
FIG. 1a is a schematic of a free space interconnect from a board to an adjacent board using capacitive coupling.

Referring firstly to FIGS. 1a–1d, various options for making a free space interconnect between adjacent boards will be described. In the system illustrated in FIG. 1a, a capacitive coupling is used between adjacent boards 10,12 located in a shelf (not shown). Board 10 has a transmitter 14 mounted on that side of the board which faces board 12. The transmitter 14 is integrally connected to a metallic disc 16 which is spaced from and extends parallel to the board 10. The transmitter 14 together with metallic disc 16 form a free-space transmit coupler. Board 12 has a receiver 18 mounted on that side of board 12 which faces board 10. The receiver 18 is integrally connected to a metallic disc 20 which is spaced from and extends parallel to the board 12. The receiver 18 together with metallic disc 20 form a free-space receive coupler. Data to be transmitted from board 10 to board 12 is transformed by transmitter 14 onto a capacitive signal within a space defined generally by oval 21 which is transmitted between the two metallic discs 16, 20. Receiver 18 transforms the capacitive signal back onto electrical form and recovers the data. A pair of grounded conductive cylinders 22,23 on respective boards 10,12 are provided as grounded shields to prevent EMI (electromagnetic interference). The grounded cylinder 22 extends from the level of board 10 to the level of the metallic disc 16 while the grounded cylinder 23 extends from the level of board 12 to the level of the metallic disc 20. The grounded conductive cylinders 22,23 prevent stray electric fields in the shelf from encroaching into the input of the receiver 18, and also prevent the transmitter 14 from emitting stray electrical fields into the shelf. Just sliding the boards 10 and 12 into the shelf and latching them in place as usual, automatically aligns the metallic discs 16 and 20 for optimum capacitive coupling.

Figure 1B:
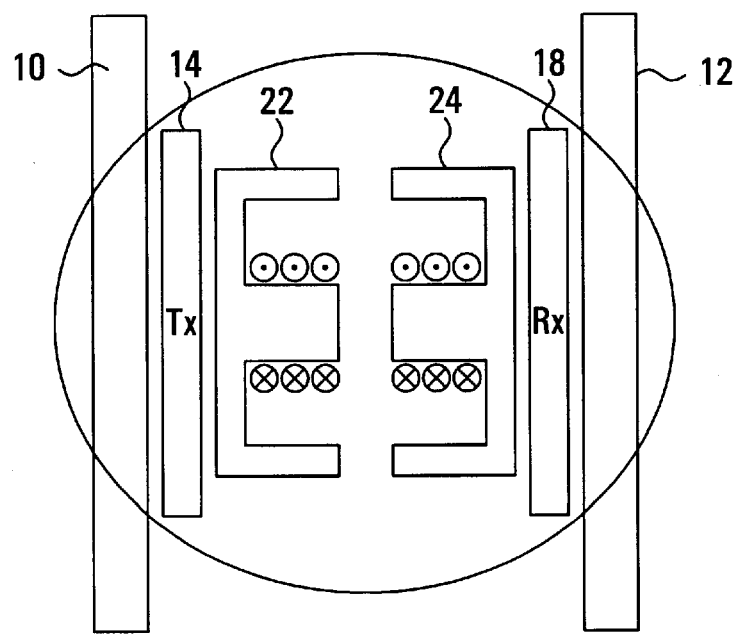
FIG. 1b is a schematic of a free space interconnect from a board to an adjacent board using magnetic coupling.

In the system illustrated in FIG. 1b, a magnetic coupling is used between adjacent boards 10,12 located in a shelf (not shown). Board 10 has a transmitter 14 mounted on that side of board 10 which faces board 12. The transmitter 14 is integrally connected to a magnetic pot core half 24 which extends perpendicular to the board 10. The transmitter 14 together with magnetic pot core half 24 form a free-space transmit coupler. Board 12 has a receiver 18 mounted on that side of board 12 which faces board 10. The receiver 18 is integrally connected to a magnetic pot core half 25 which extends perpendicular to the board 12. The receiver 18 together with magnetic pot core half 25 form a free-space receive coupler. Data to be transmitted from board 10 to board 12 is transformed by transmitter 14 onto a magnetic signal within a space defined generally by oval 26 which is transmitted between the two magnetic pot core halves 24,25. Receiver 18 transforms the magnetic signal back onto electrical form and recovers the data. EMI to and from this physical arrangement is usually not a problem, and an extra magnetic shield is not required. Just sliding the boards 10 and 12 into the shelf and latching them in place as usual, automatically aligns the magnetic pot core halves 24 and 25 for optimum magnetic coupling.

Figure 1C:
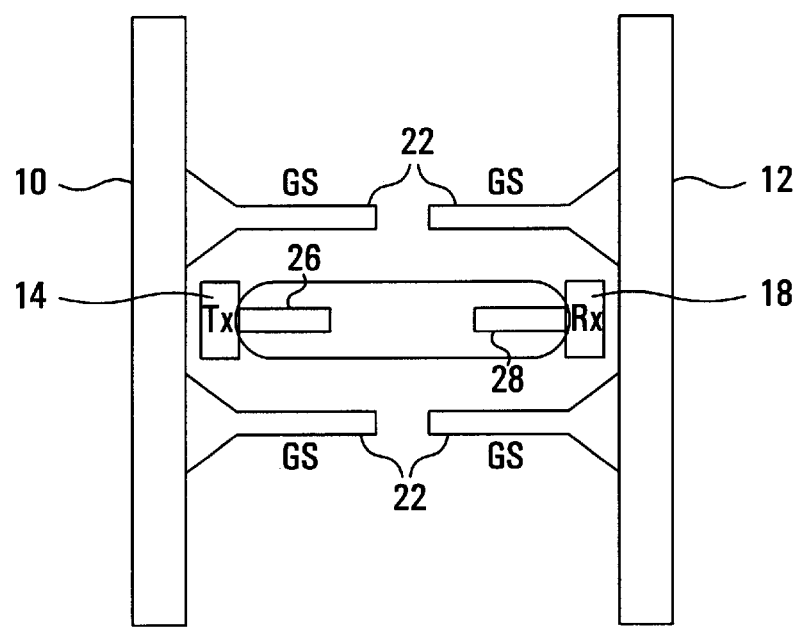
FIG. 1c is a schematic of a free space interconnect from a board to an adjacent board using electromagnetic coupling.

In the system illustrated in FIG. 1c, an electromagnetic coupling is used between adjacent boards 10,12 located in a shelf (not shown). Board 10 has a transmitter 14 mounted on that side of the board which faces board 12. The transmitter 14 is integrally connected to an antenna 27 which extends perpendicular to the board 10. The transmitter 14 together with antenna 27 form a free-space transmit coupler. Board 12 has a receiver 18 mounted on that side of board 12 which faces board 10. The receiver 18 is integrally connected to an antenna 28 which extends perpendicular to the board 12. The receiver 18 together with antenna 28 form a free-space receive coupler. Data to be transmitted from board 10 to board 12 is transformed by transmitter 14 onto an electromagnetic signal within a space defined generally by signal envelope 29 which is transmitted between the two antennas 27,28. Receiver 18 transforms the electromagnetic signal back onto electrical form and recovers the data. A pair of grounded conductive cylinders 22,23 on both boards 10,12 are provided as grounded shields to prevent EMI. The grounded cylinder 22 extends from the level of board 10 to slightly beyond the end of the antenna 27 while the grounded cylinder 23 extends from the level of board 12 to slightly beyond the end of antenna 28. The grounded conductive cylinders 22,23 prevent stray electric fields in the shelf from encroaching into the input of the receiver 18, and also prevent the transmitter 14 from emitting stray electrical fields into the shelf. Just sliding the boards 10 and 12 into the shelf, and latching them in place as usual, automatically aligns the antennas 27 and 28 for optimum electromagnetic coupling.

Figure 1D:
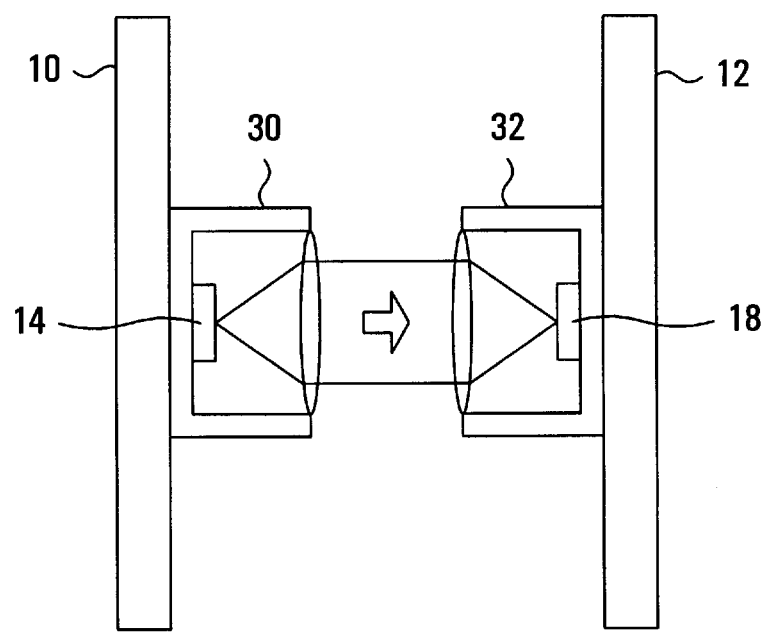
FIG. 1d is a schematic of a free space interconnect from a board to an adjacent board using optical coupling.

In the system illustrated in FIG. 1d, an optical coupling is used between adjacent boards 10,12 located in a shelf (not shown). Board 10 has a transmitter 14 mounted on that side of the board which faces board 12. The transmitter 14 is integrally connected to an optical emitter 30 in a surface mount package with a collimating lens which extends perpendicular to board 10. The surface mount package including the transmitter 14, optical emitter 30 and collimating lens form a free-space transmit coupler. Board 12 has a receiver 18 mounted on that side of board 12 which faces board 10. The receiver 18 is integrally connected to an optical detector 32 such as a PIN diode or APD in a surface mount package with a collimating lens extending perpendicular to board 12. The surface mount package including the receiver 18 and the optical detector with collimating lens form a receive coupler. Data to b e transmitted from board 10 to board 12 is transformed by transmitter 14 onto an optical signal within a space defined generally by signal envelope 33 which is transmitted between the emitter 30 and the detector 32. Receiver 18 transforms the optical signal back onto electrical form and recovers the data. The collimating lenses prevent the emitter 30 from emitting stray light into the shelf and prevent ambient light in the shelf from straying into the detector 32. Just sliding the boards 10 and 12 into the shelf and latching them in place as usual, automatically aligns the emitter 30 and the detector 32 for optimum optical coupling.

Figure 2:
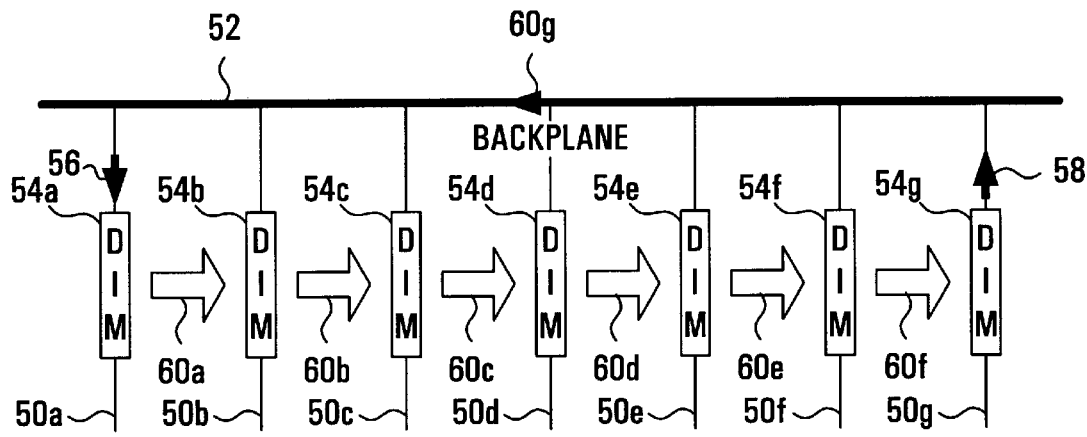
FIG. 2 is a schematic of a free-space interconnect system according to an aspect of the invention.

Now referring to FIG. 2, a system according to the invention is shown schematically which permits data transfer from any board in a shelf to any other board in the shelf. Seven boards 50a–50g are mounted in a shelf (not shown) having a backplane 52. The boards all extend from the backplane in spaced relationship with one another. Each board has a DIM (drop-insert-multiplexer) 54a–54g mounted thereon. Each of the DIMs on boards 50a–50g is equipped with a free-space transmit coupler on a first side of the board and a free-space receive coupler on a second side of the board. The couplers may be as described with reference to FIGS. 1a–1d above.

Figure 6:
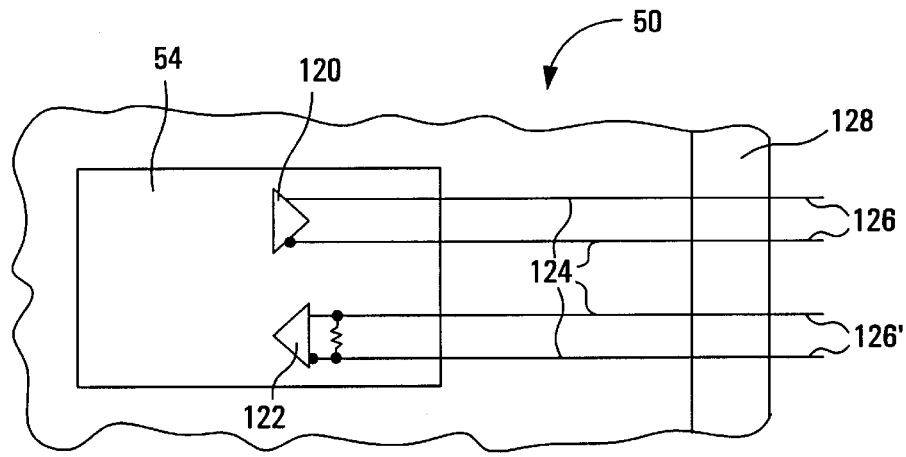
FIG. 6 is a schematic view of a portion of a side of a board.

As can be seen in FIG. 6, each board also has a backplane transmit coupler 120 and a backplane receive coupler 122 connected via copper conductors 124 on the board to pins 126 and 126' of an edge connector 128. Thus, pins 126 are electrically connected to transmit coupler 120 and pins 126' are electrically connected to receive coupler 122.

Figure 7:
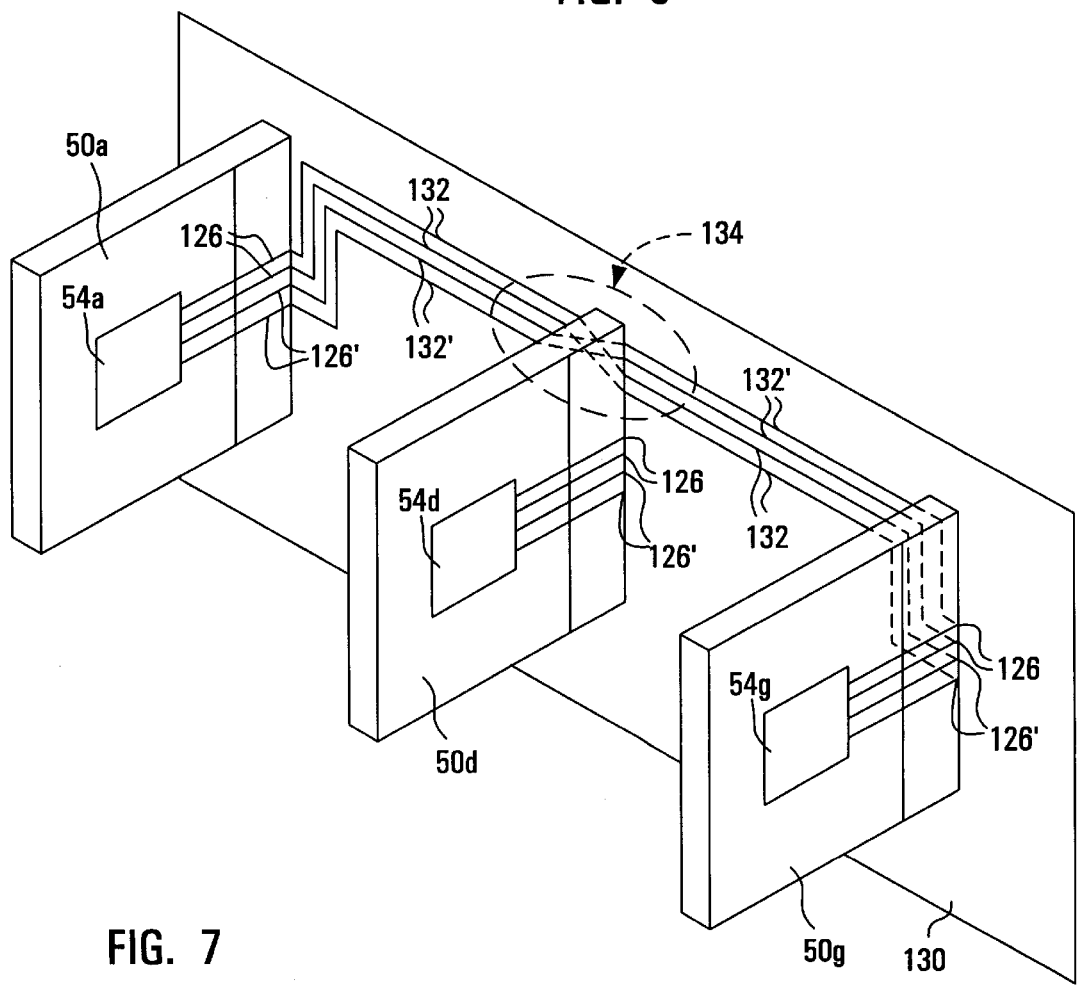
FIG. 7 is a schematic perspective view illustrating several boards mounted in a shelf backplane.

As can be seen in FIG. 7, the backplane 130 has copper conductors 132 and 132' which interconnect contacts on the backplane which mate with the pins 126 and 126' of the first and last boards.

More particularly, conductor pair 132 crosses over conductor pair 132' at an intermediate region 134 such that conductor pair 132 interconnects pins 126 of the first board with pins 126' of the last board and conductor pair 132' interconnects pins 126' of the first board with pins 126 of the last board. In that way, the backplane transmit coupler 120 of the first board is interconnected with the backplane receive coupler 122 of the last board and the backplane receive coupler 122 of the first board is interconnected with the backplane transmit coupler 120 of the last board. This crossover can be achieved according to a standard technique using a 2 layer backplane in which conductor pair 132 is entirely in the top layer and conductor pair 132' is also in the top layer except at the crossover where it passes along vias to the bottom layer.

The copper conductors 132 are offset such that they do not interconnect the pins 126 on any of the boards between the first and last boards.

Each free-space transmit coupler transmits data through free-space and each free-space receiver coupler receives data transmitted through free-space from any adjacent board. A closed loop 60 connects all of the boards, the closed loop consisting of free-space links 60a to 60f and backplane link 60g with signals travelling in the direction of the arrows illustrated. The free-space receive coupler of first board 50a and the free-space transmit coupler of last board 50g are not used. The backplane transmit and receive couplers 120 and 122 of the in-between boards 54b to 54f are also not used. This is because the backplane conductors connect only the first and last boards. Each DIM has an incoming data stream being received from the closed loop 60 and an outgoing data stream being transmitted onto the closed loop 60. Each board is logically addressable over the closed loop 60. In this system, the backplane connectors 56,58 of the first 50a and last board 50g must carry the data on the loop 60, but all other boards are relieved of the need for backplane connectors for signal carriage. All boards still need power supply pins to the backplane.

In use, data to be sent by a board to a destination board is inserted onto the outgoing data stream along with the logical address of the destination board. The board which is downstream of the transmitting board receives the data transmitted. Each logical address received on the incoming data stream is examined and the associated data is removed or "dropped" from the data stream by the DIM on the board if the logical address matches the address "burned" into the DIM of that particular board. If the logical address does not match the address "burned" into the DIM of that particular board, then the associated data is passed on to the outgoing data stream. This process is repeated by all of the boards in the communications loop until all data transmitted by all boards arrive at the proper destination boards.

The logical addressing of data to a specific board as described above allows the boards in the shelf to be interchanged with each other with no effect on the data communications between boards. This is to be contrasted with existing intra-shelf communication schemes in which physical addressing is employed which does not allow for interchangeability of boards.

In this embodiment of a single, closed, communication loop, the boards can be equipped to detect a failure of a free-space interconnect link and to produce an alarm indicating this fact, but no back-up communications links exist.

In the embodiment illustrated, each DIM package is mounted in the plane of each board and includes the free-space transmit and receive couplers, drop-insert functionality, and backplane receive and transmit couplers in a single integrated unit. The technical difficulties normally associated with the construction of such an integrated unit do not apply in this case because the close proximity of the transmit and receive couplers permits similar signal strengths to be used for transmission and reception without the transmission interfering with the reception. Alternatively, the DIM, transmit and receive couplers on each board may all be separate components which are connected together.

Each board has exactly the same transmit/receive capability as the other boards with the free-space transmit coupler and free-space receive coupler mounted at the same location, but on opposite sides of the board so that when the boards are inserted in a shelf the transmit couplers and receive couplers are automatically aligned.

Figure 3:
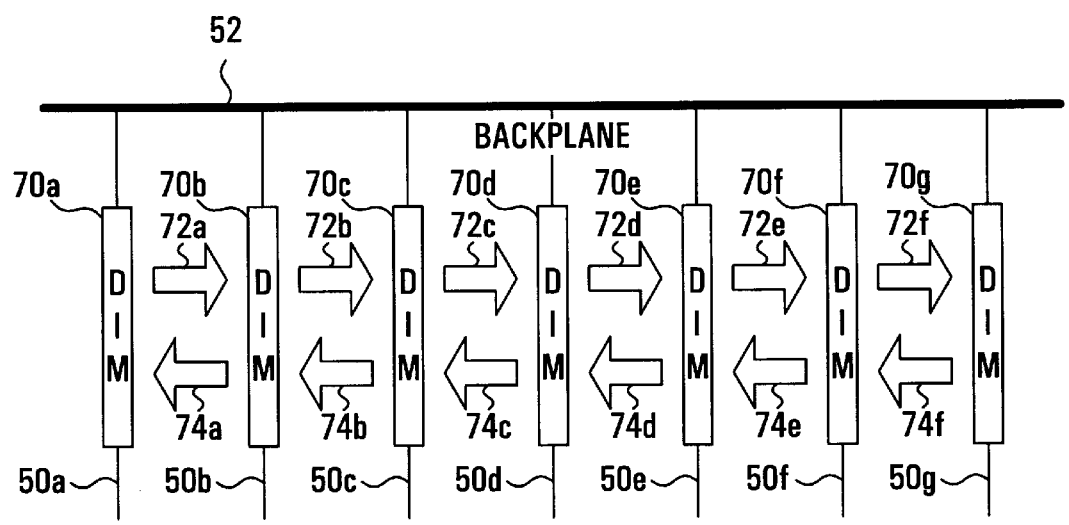
FIG. 3 is a schematic of a free-space interconnect system according to another aspect of the invention.

A board-to-board interconnect system according to the invention which does not require any communication over the backplane is shown schematically in FIG. 3. In this case, each board 50a–50g is equipped with a DIM 70a–70g having a pair of free-space transmit couplers mounted on opposite sides of the board and a pair of free-space receiver couplers also mounted on opposite sides of the board. The boards may also have backplane transmit and receive couplers as in the case of the embodiment of FIG. 2 but these are not used in this embodiment because the backplane is not provided with the copper traces to connect the first and last boards in the shelf. Thus, there is no communications loop through the backplane. Instead the closed communications loop is entirely trough the boards and consists of free-space data links 72a–72f going from the first board 50a to the last board 50g and free-space data links 74f–74e going from the last board 50g to the first board 50a. Although there are no backplane connections for signals in this embodiment, all of the boards are provided with power supply pins for connection to the backplane.

In use, this system operates similar to the system of FIG. 2 except that now each board with the exception of the first and last boards 50a, 50g has two possible directions in which to send/receive data. Each in-between board sends the data in both directions. The other boards will receive a first copy of the data from one direction and a second copy of the data from the opposite direction. Each receiving board will examine the second copy of the data received and determine that a copy has already been received. This may be achieved by time stamping the transmitted data. If a board receives an identical time stamp, it discards this copy. If data frames are used, this may be achieved by including a framing bit in each frame which toggles for even and odd frames. Copies of data received from a frame that has already been received (as indicated by the framing bit), can be discarded.

In an alternative, simpler operation of the system of FIG. 3 the DIM sends the data only once, either in path 72 or in path 74, in the next available timeslot. The logical operation of the system in FIG. 3 then becomes virtually identical to that of the system in FIG. 2. The only difference is that the DIM in FIG. 2 only monitors one path to insert its data in the next available timeslot, whereas the DIM in FIG. 3 monitors two paths to insert its data in the next available timeslots. Because all boards are identically equipped with two free-space receive couplers and with two free-space transmit couplers whichever boards are in the first and last position will assume the role of looping the signal back in the opposite direction. Boards know that they are in a first or last position by sensing a pair of shorted pins on the backplane.

If the boards are equipped to detect failure of free-space interconnect links, the system can survive the complete failure of a board and still provide some limited communications capability. For example, if board 50d fails, then boards 50a, 50b, 50c can still communicate with each other via a first isolated loop consisting of links 72a, 72b, DIM 70c and links 74b, 74a, and DIM 70a, and boards 50e, 50f, 50g can still communicate with each other via a second isolated loop consisting of links 74f, 74e, DIM 70e and links 72e, 72f and DIM 70g.

Figure 4A:
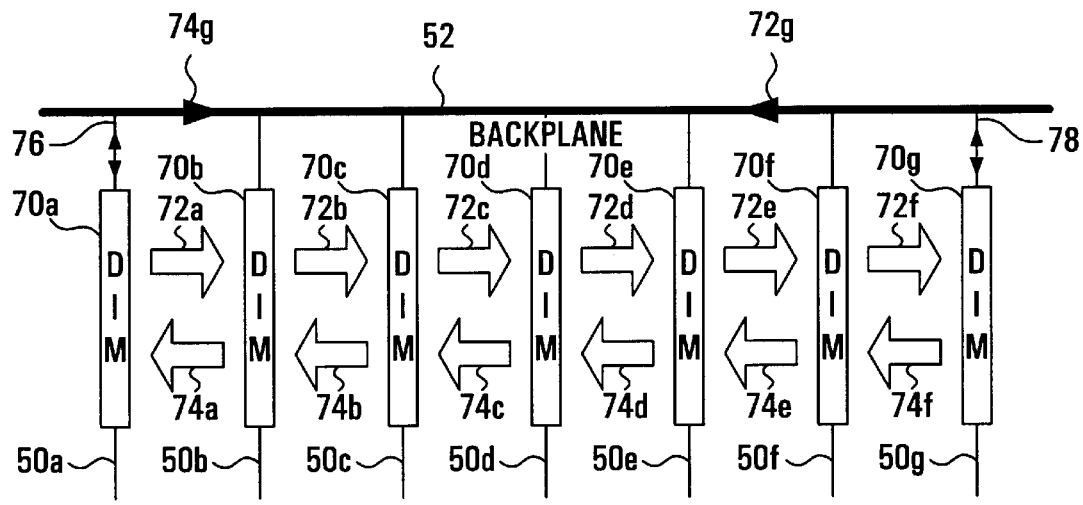
FIG. 4a is a schematic of a free-space interconnect system according to another aspect of the invention.

Another board to board interconnect system according to the invention is shown schematically in FIG. 4a. Each board in this system may be identical with the boards used in FIG. 3 with the proviso that backplane transmit and receive couplers must be included. However the backplane does have copper conductors interconnected with the first and last boards 50a–50g through backplane edge connectors 128a, 128g as in the FIG. 2 embodiment respectively. Thus, a first closed communication loop is established from board 50a to board 50g via free-space data links 72a–72g and back through the backplane 52. Similarly, a second closed communications loop is established from board 50g to board 50a via free-space data links 74g–74a and back through the backplane 52. It can be seen that the system of FIG. 4a can be considered as providing two communications loops, each communications loop operating as per FIG. 2 but with signals flowing in opposite directions.

With the embodiment of FIG. 4a, the system is not only capable of detecting when one of the boards in the shelf has failed but also of rerouting signals away from the failed board and maintaining data transmission between the remaining functional boards. A failed board will break the continuity of loop section 72 or loop section 74 or both loop sections 72 and 74. Board 50c to the left of board 50d reroutes incoming data stream 72b to outgoing data stream 74b. This is shown symbolically by data stream 80, but this would actually occur within the DIM itself. Similarly, board 50e to the right of board 50d reroutes incoming data stream 74e to outgoing data stream 72e, shown symbolically by data stream 82. Thus, a closed communications loop is retained connecting all operational boards, and allowing for data transmission between all operational boards.

Many other reliability schemes can be implemented. In some implementations, the boards may be designed to perform self-diagnosis and if a fault is diagnosed to send a control signal to the adjacent boards instructing them to reroute signals and to cause a system alarm to be activated.

As with the last embodiment, the boards are fully interchangeable; whichever boards are in the first and last position will communicate through the backplane by virtue of copper conductors on the backplane interconnecting the first and last boards.

Debugging boards in shelves requires the use of an extender card which is positioned in the slot which the board under test normally occupies. The extender card extends from the backplane to the front of the shelf and provides means for attachment of the board under test to provide free physical access to both sides of the board under test. The extender card also provides connections between the backplane of the shelf and the board under test to provide power and communications to the board under test. The board under test, being free of the narrow confines of the shelf can be worked on freely while the debugging procedure is being carried out.

Figure 5:
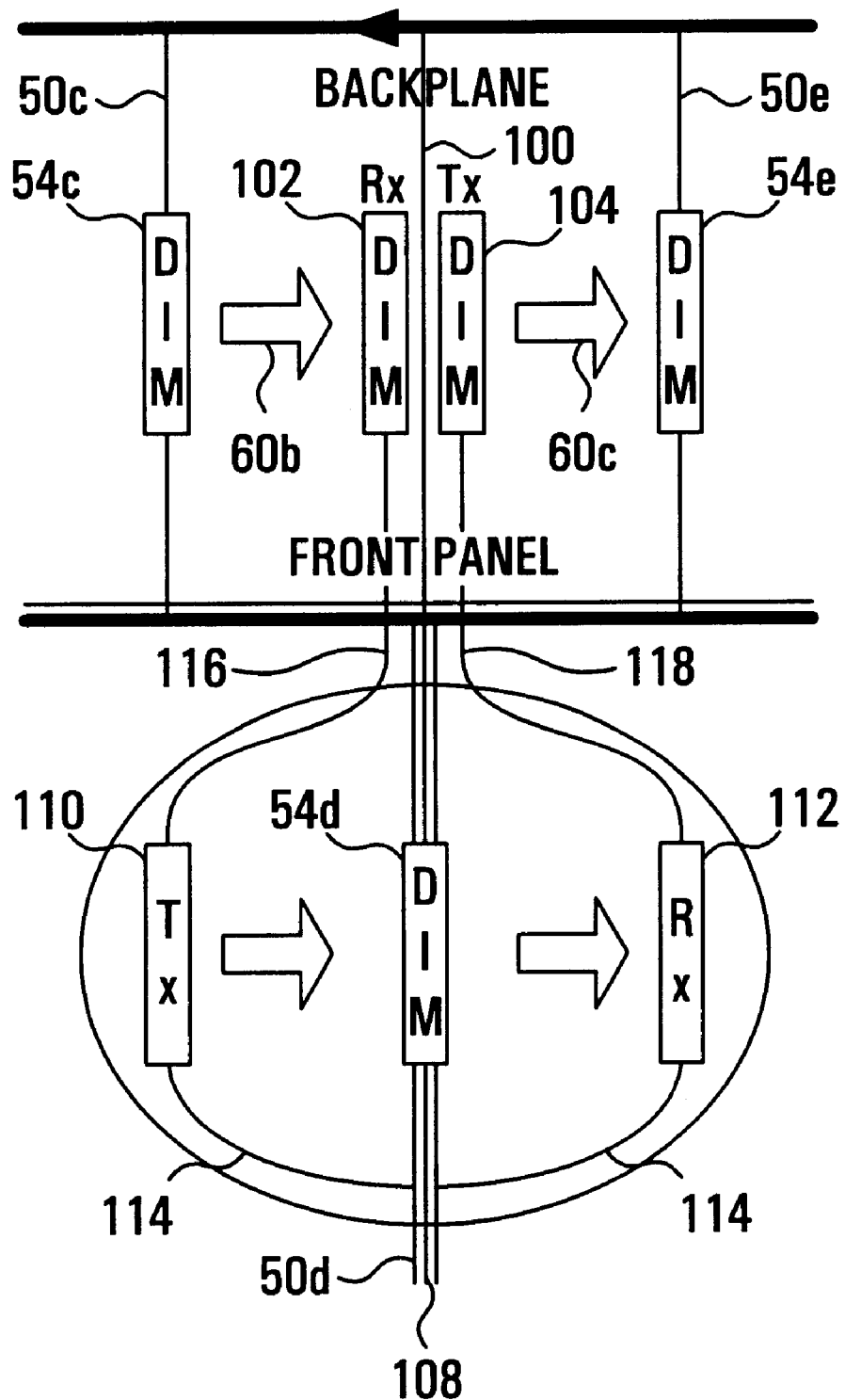
FIG. 5 is a schematic of an extender card for debugging purposes for use with the system of FIG. 2.

A simple extender card has been developed for the boards used in the inventive systems described above. This card is shown in FIG. 5. In the example illustrated, an extender card 100 has been installed in a shelf (not shown) in place of a board 50d (for example) to be tested. The extender card 150 is equipped with a free-space receive coupler 102 on that side of the extender card which faces adjacent board 50c and a free-space transmit coupler 104 on that side of the extender card which faces adjacent board 50e. The extender card 100 has card guides 108 extending from the bottom and the top of the extender card in front of the shelf for supporting and holding in place the board 50d to be tested. A second free-space transmit coupler 110 and a second free-space receive coupler 112 are mounted on brackets 114 attached to the guides 108. The brackets 114 hold the second free-space transmit coupler 110 in a position facing the free-space receive coupler of the board under test 50d in its extended position. The brackets 114 hold the second free-space receive coupler 112 in a position facing the free-space transmit coupler of the board under test 50d in its extended position. Signal cables 116,118 directly connect the free-space receive coupler 102 to the free-space transmit coupler 110, and connect the free-space receive coupler 112 to the free-space transmit coupler 104, respectively.

The extender card 100 has power supply pins (not shown) which plug into the backplane and conductive lines for connecting the power supply pins on the extender card to the power supply pins of the board under test.

In use, a signal incoming on incoming data stream 60b is received by the free-space receive coupler 102 on the extender card 100 in the normal manner and routed to the free-space transmit coupler 110 through signal cable 116. The free-space transmit coupler 110 retransmits the signal towards board 50d which receives it in the normal manner. Similarly, signals transmitted by board under test 50d are received by free-space receive coupler 112 in the normal manner and routed to free-space transmit coupler 104 over signal cable 118. The free-space transmit coupler 104 retransmits the signal towards board 54e which receives it in the normal manner.

Figure 4B:
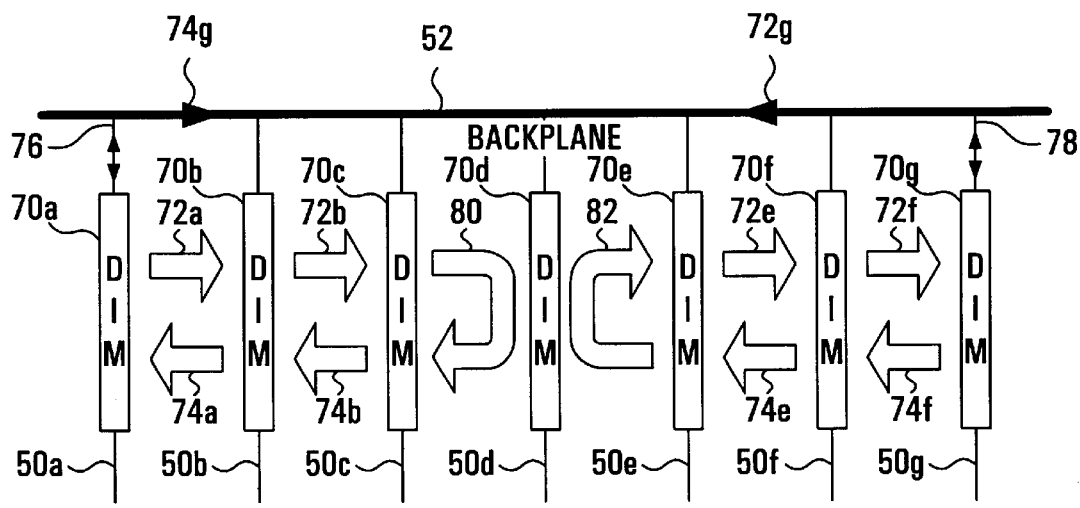
FIG. 4b is a schematic of a portion of the system of FIG. 4a in which a board has failed.

In order to test the systems illustrated in FIGS. 3 and 4, an extender card arrangement similar to the extender card of FIG. 5 may be used except there are now two signal paths which must be rerouted by the extender card.

Using an extender card allows for free physical access to both sides of the board under test at the same time. If free physical access to only one side of the board under test is needed, then the board can be moved to the appropriate end position in the shelf, either the first or last position, depending on which side of the board requires free physical access.

Numerous modifications and variations of the present invention are possible in light of the above teachings. It is therefore to be understood that within the scope of the appended claims, the invention may be practised otherwise than as specifically described herein.

I claim:

1. A free-space intra-shelf interconnect system comprising:
    a plurality of interchangeable circuit boards including a first board and a last board arranged in a shelf having a backplane, the boards extending from the backplane in spaced relationship with one another;
    each board having a free-space transmit coupler mounted on a first side of the boards for transmitting data through free-space, a free-space receive coupler mounted on a second side of the board for receiving data transmitted through free space from any adjacent board, a backplane transmit coupler and a backplane receive coupler;
    each board having a drop-insert multiplexer for;
        i) inserting data to be transmitted by the board into an outgoing signal, the data including a logical address of a board to receive the data; and
        ii) extracting data addressed to the board from an incoming signal and forwarding on the outgoing signal all other data received on the incoming signal;
    the backplane having electrical conductors electrically connecting the backplane transmit coupler of the last board to the backplane receive coupler of the first board, whereby a closed data communication loop extends from the first board through all the intervening boards to the last board and back from the last board through the backplane to the first board.

2. A system according to claim 1 wherein for each board, the receive and transmit couplers and the drop-insert multiplexer are integrated together in a single unit.

3. A system according to claim 2 wherein each integrated unit further comprises means for performing self-diagnosis and sending control signals to adjacent boards to reroute data and processing means for detecting failed adjacent boards and rerouting data within the drop-insert multiplexer away from a failed adjacent board.

4. A system according to claim 1 wherein the free-space transmit couplers and free-space receive couplers are optical couplers.

5. A system according to claim 1 wherein the free-space transmit couplers and free-space receive couplers are magnetic couplers.

6. A system according to claim 1 wherein the free-space transmit couplers and free-space receive couplers are electromagnetic couplers.

7. A system according to claim 1 wherein the free-space transmit couplers and free-space receive couplers are capacitive couplers.

8. An extender card for use in a system according to claim 1 for insertion into said shelf in place of a specified board, the extender card comprising:
    a) holding means for holding said specified board in an extended position;
    b) a first free-space receive coupler mounted on one side of the extender card for receiving from an adjacent board a first free-space signal which would have been the incoming signal of the specified board if it was installed normally;
    c) a first free-space transmit coupler mounted facing and at a normal spaced distance from the free-space receive coupler of the specified board in its extended position for retransmitting the first signal so as to be a free-space signal receivable by the free-space receive coupler of the specified board in its extended position;
    d) a second free-space receive coupler mounted facing and at the normal spaced distance from the free-space transmit coupler of the specified board in its extended position for receiving a second free-space signal which is the outgoing signal of the specified board in its extended position; and
    e) a second free-space transmit coupler mounted on the side of the extender card opposite said one side for retransmitting the second signal so as to be a free-space signal receivable by the free-space receive coupler of an adjacent board.

9. A free-space intra-shelf interconnect system comprising:

a plurality of interchangeable circuit boards including a first board and a last board arranged in a shelf having a backplane, the boards extending from the backplane in spaced relationship with one another;

each board having a pair of free-space transmit couplers mounted on opposite sides of the board for transmitting data through free-space and a pair of free-space receive couplers mounted on opposite sides of the board for receiving data transmitted through free-space from any adjacent boards;

each board having a drop-insert multiplexer for:
  i) inserting data to be transmitted by the board into outgoing signals, the data including a logical address of a board to receive the data; and
  ii) extracting data addressed to the board from incoming signals and forwarding on the outgoing signals all other data received on the incoming signals;

whereby a closed data communication loop extends from the first board through all the intervening boards to the last board and back from the last board through all the intervening boards to the first board.

10. A system according to claim 9 wherein each board is provided with means for sensing a pair of shorted pins on the backplane to thereby determine whether the board is either a first or last board or an intermediate board and means for causing the drop-insert multiplexer on a board determined to be the first or last board to reroute data from the free-space receive coupler facing another board through the drop-insert multiplexer to the free-space transmit coupler on the same side of the board.

11. A system according to claim 9 wherein for each board, the receive and transmit couplers and the drop-insert multiplexer are integrated together in a single unit.

12. A system according to claim 9 wherein each integrated unit further comprises means for performing self-diagnosis and sending control signals to adjacent boards to reroute data and processing means for detecting failed adjacent boards and rerouting data within the drop-insert multiplexer away from a failed adjacent board.

13. A system according to claim 9 wherein the free-space transmit couplers and free-space receive couplers are optical couplers.

14. A system according to claim 9 wherein the free-space transmit couplers and free-space receive couplers are magnetic couplers.

15. A system according to claim 9 wherein the free-space transmit couplers and free-space receive couplers are electromagnetic couplers.

16. A system according to claim 9 wherein the free-space transmit couplers and free-space receive couplers are capacitive couplers.

17. A system according to claim 9 in which the drop-insert multiplexer on each board comprises means to detect a failure in an adjacent board, the drop-insert multiplexer on each board adjacent the failed board rerouting data from the free-space transmit coupler adjacent the failed board through the drop-insert multiplexer to the free-space receive coupler adjacent the failed board.

18. A system according to claim 9 in which each board is provided with means for self-diagnosis and means for sending, on diagnosing a fault, a control signal to adjacent boards to reroute data.

19. An extender board for use in a system according to claim 9 for insertion into said shelf in place of a specified board, the extender board comprising:
  a) holding means for holding said specified board in an extended position;
  b) for each free-space receive coupler on the specified board:
    i) a corresponding free-space receive coupler mounted on one side of the extender board for receiving from an adjacent board the free-space signal which would have been received by the respective free-space receive coupler on the specified board if the specified board was installed normally;
    ii) a corresponding free-space transmit coupler mounted facing and at a normal spaced distance from the respective free-space receive coupler on the specified board in its extended position for retransmitting the signal received by the corresponding free-space receive coupler so as to be a free-space signal receivable by the respective free-space receive coupler of the specified board in its extended position;
  c) for each free-space transmit coupler on the specified board:
    i) a corresponding free-space receive coupler mounted facing and at the normal spaced distance from the respective free-space transmit coupler on the specified board in its extended position for receiving the free-space signal transmitted by the respective free-space transmit coupler of the specified board in its extended position;
    ii) a corresponding free-space transmit coupler mounted on the side of the extender board opposite said one side for transmitting to an adjacent board the free-space signal which would have been transmitted by the respective free-space transmit coupler on the specified board if the specified board was installed normally.

20. A free-space intra-shelf interconnected system comprising:
  a plurality of interchangeable circuit boards including a first board and a last board arranged in a shelf having a backplane, the boards extending from the backplane in spaced relationship with one another;
  each board having a pair of free-space transmit couplers mounted on opposite sides of the board for transmitting data through free-space and a pair of free-space receive couplers mounted on opposite sides of the board for receiving data transmitted through free-space from any adjacent boards;
  each board having a drop-insert multiplexer for:
    i) inserting data to be transmitted by the board into outgoing signals, the data including the logical address of a board to receive the data; and
    ii) extracting data addressed to the board from incoming signals and forwarding the outgoing signals all other data received in the incoming signals;
  the backplane having electrical conductors electrically connecting the backplane transmit coupler of the last board to the backplane receive coupler of the first board and electrically connecting the backplane transmit coupler of the first board to the backplane receive coupler of the last board, whereby a first closed data communication loop extends from the first board through all the intervening boards to the last board and back from the last board through the backplane to the first board and a second closed data communication loop extends from the last board through all the intervening boards to the first board; and back from the first board through the backplane to the last board.

21. A system according to claim 20 wherein for each board, the receive and transmit couplers and the drop-insert multiplexer are integrated together in a single unit.

22. A system according to claim 20 wherein each integrated unit further comprises means for performing self-diagnosis and sending control signals to adjacent boards to reroute data and processing means for detecting failed adjacent boards and rerouting data within the drop-insert multiplexer away from a failed adjacent board.

23. A system according to claim 20 wherein the free-space transmit couplers and free-space receive couplers are optical couplers.

24. A system according to claim 20 wherein the free-space transmit couplers and free-space receive couplers are magnetic couplers.

25. A system according to claim 20 wherein the free-space transmit couplers and free-space receive couplers are electromagnetic couplers.

26. A system according to claim 20 wherein the free-space transmit couplers and free-space receive couplers are capacitive couplers.

27. A system according to claim 20 in which the drop-insert multiplexer on each board comprises means to detect a failure in any adjacent board, the drop-insert multiplexer on each board adjacent the failed board rerouting data from the free-space transmit coupler adjacent the failed board through the drop-insert multiplexer to the free-space receive coupler adjacent the failed board.

28. An integrated unit for mounting on a circuit board of a free-space intra-shelf interconnect system, the integrated unit comprising:
   a) a free-space receive coupler for receiving data on an incoming free-space signal;
   b) a free-space transmit coupler for transmitting data on an outgoing free-space signal;
   c) a backplane transmit coupler for transmitting data to a backplane of a shelf;
   d) a backplane receive coupler for receiving data from a backplane of a shelf;
   e) a drop-insert multiplexer for extracting data from the incoming signal addressed to that board, forwarding all other data received on the ingoing signal on the outgoing signal, and inserting data to be transmitted by that board into the outgoing signal.

29. An integrated unit according to claim 28 further comprising processing means for performing self-diagnosis and sending control signals to adjacent boards to reroute data and processing means for detecting failed adjacent boards and rerouting data within the drop-insert multiplexer away from a failed adjacent board.

30. A circuit board for mounting in a shelf having a backplane, the circuit board having a free-space transmit coupler mounted on a first side of the board for transmitting data through free-space to an adjacent board; a free-space receive coupler mounted on a second side of the board for receiving data transmitted through free-space from an adjacent board; an edge connector for connecting to the backplane; a coupler for coupling data through the edge connector to or from the backplane; and a drop-insert multiplexer for:
   i) inserting data to be transmitted by the board, the data including a logical address of a board to receive the data; and
   ii) extracting data addressed to the board and forwarding all other data received.

31. A circuit board according to claim 30, wherein the receive and transmit couplers and the drop-insert multiplexer are integrated in a single unit.

32. A circuit board according to claim 31 wherein the integrated unit further comprises means for performing self-diagnosis and sending control signals to adjacent boards to reroute data and processing means for detecting failed adjacent boards and rerouting data within the drop-insert multiplexer away from a failed adjacent board.

33. A circuit board for mounting in a shelf having a backplane, the circuit board having a pair of free-space transmit couplers mounted on the opposite sides of the board for transmitting data through free-space to any adjacent boards; a pair of free-space receive couplers mounted on opposite sides of the board for receiving data through free-space from any adjacent boards; an edge connector for connecting to the backplane; a coupler for coupling data through the edge connector to or from the backplane; and a drop-insert multiplexer for:
   i) inserting data to be transmitted by the board, the data including a logical address of a board to receive the data; and
   ii) extracting data addressed to the board and forwarding all other data received.

34. A circuit board according to claim 33, wherein the receive and transmit couplers and the drop-insert multiplexer are integrated in a single unit.

35. A circuit board according to claim 34 wherein the integrated unit further comprises means for performing self-diagnosis and sending control signals to adjacent boards to reroute data and processing means for detecting failed adjacent boards and rerouting data within the drop-insert multiplexer away from a failed adjacent board.

* * * * *